United States Patent
Huang

(10) Patent No.: US 12,203,613 B1
(45) Date of Patent: Jan. 21, 2025

(54) FLEXIBLE LED STRIP

(71) Applicant: Shenzhen Bright Lighting Technology Co., Ltd, Shenzhen (CN)

(72) Inventor: Eric Huang, Shenzhen (CN)

( * ) Notice: Subject to any disclaimer, the term of this patent is extended or adjusted under 35 U.S.C. 154(b) by 0 days.

(21) Appl. No.: 18/672,588

(22) Filed: May 23, 2024

(30) Foreign Application Priority Data

Mar. 28, 2024 (CN) .......................... 202420635954.9

(51) Int. Cl.
*F21S 4/22* (2016.01)
*F21V 23/00* (2015.01)
*F21Y 115/10* (2016.01)

(52) U.S. Cl.
CPC .............. *F21S 4/22* (2016.01); *F21V 23/002* (2013.01); *F21Y 2115/10* (2016.08)

(58) Field of Classification Search
CPC ....... F21S 4/22; F21S 4/24; F21S 4/26; F21V 23/002; F21Y 2115/10; F21Y 2107/70; F21Y 2105/10; F21Y 2107/50
See application file for complete search history.

(56) References Cited

U.S. PATENT DOCUMENTS

| | | | |
|---|---|---|---|
| 2005/0092517 A1* | 5/2005 | Fan | F21S 4/24 174/117 FF |
| 2015/0117001 A1* | 4/2015 | Fan | H05K 3/10 29/850 |
| 2021/0190303 A1* | 6/2021 | Diana | F21V 23/005 |

* cited by examiner

*Primary Examiner* — Bao Q Truong

(57) ABSTRACT

A flexible light-emitting diode (LED) strip includes a long-strip-shaped insulating soft film. Two first wires and a plurality of LEDs are arranged on a surface of one side of the insulating soft film in a lengthwise direction. The two first wire are connected to each other for conduction, and the plurality of LEDs are located between the two first wires. Two second wires and a third wire are arranged on a surface of the other side of the insulating soft film in the lengthwise direction. The two second wires are arranged side by side in a width direction of the insulating soft film, and the third wire is located between the two second wires. The first wires are connected to one pin end of the LEDs, and the second wires are connected to the other pin end of the LEDs.

20 Claims, 2 Drawing Sheets

FLEXIBLE LED STRIP

CROSS-REFERENCE TO RELATED APPLICATIONS

This application claims priority benefit of Chinese patent Application No. 202420635954. 9, filed on Mar. 28, 2024, now pending, the entire disclosures of which are incorporated herein by reference.

TECHNICAL FIELD

The present disclosure relates to the technical field of light-emitting diode (LED) lamps, and in particular, to a flexible LED strip.

BACKGROUND

A flexible LED strip, also referred to as a flexible neon tube, is the latest and most popular breakthrough LED product recently. The flexible LED strip is produced to make up for the deficiencies of a glass neon tube and an optical fiber, and completely replace the glass neon tube and the optical fiber. The flexible LED strip uses a flexible printed circuit board (FPC) as an assembling circuit board, and surface mounted device (SMD) LEDs are used for assembling, so that a product will not occupy a space because its thickness is only equal to a thickness of a coin. The SMD LEDs have common specifications, including 18 LEDs with a length of 30 cm, 24 LEDs with a length of 30 cm, 15 LEDs with a length of 50 cm, 24 LEDs with a length of 50 cm, 30 LEDs with a length of 50 cm, and LEDs with lengths of 60 cm and 80 cm. Different users use different specifications. Furthermore, the flexible LED strip can be freely cut or extended without affecting its light emission. The FPC material is soft and can be bent, folded, and wound at will. The flexible LED strip can move and stretch freely in a three-dimensional space without breakage and is suitable for being used in irregular places and narrow spaces. Furthermore, the flexible LED strip may be further suitable for being combined into various patterns at will in advertising decoration because it can be bent and wound at will.

When the existing LED flexible strip is bent and twisted, it is possible to damage a sheet-like wire, causing poor contact or direct circuit breakage. As a result, the strip fails. Therefore, there is a need for a high-reliability flexible light strip that can effectively avoid damage during bending or twisting.

SUMMARY

The present disclosure aims to provide a flexible LED strip to overcome the deficiencies in the prior art. The flexible LED strip can well solve the above problems.

To achieve the above requirements, the technical solutions used in the present disclosure to solve the technical problems is as follows:

A flexible light-emitting diode (LED) strip, includes a long-strip-shaped insulating soft film, wherein a plurality of first wires and a plurality of LEDs are arranged on a surface of one side of the insulating soft film in a lengthwise direction; the plurality of first wires are connected to each other for conduction; the plurality of LEDs are all located between two of the first wires; a plurality of second wires are arranged on a surface of the other side of the insulating soft film in the lengthwise direction; the plurality of second wires are connected to each other for conduction; the first wires are connected to one pin end of the LEDs for conduction; and the second wires are connected to the other pin end of the LEDs for conduction.

As an improvement of the present disclosure, the plurality of first wires are arranged side by side and connected to each other for conduction in a width direction of the insulating soft film, and the plurality of second wires are arranged side by side and connected to each other for conduction in the width direction of the insulating soft film.

As an improvement of the present disclosure, there are two first wires and two second wires.

As an improvement of the present disclosure, a thickening part is arranged on the surface of the other side of the insulating soft film in the lengthwise direction, and the thickening part is oriented towards the LEDs.

As an improvement of the present disclosure, the thickening part is a soldering tin thickening part.

As an improvement of the present disclosure, a width of the thickening part is greater than a width of each LED, and a length of the thickening part is greater than a length of each LED.

As an improvement of the present disclosure, the thickening part is square.

As an improvement of the present disclosure, the flexible LED strip further includes a third wire, wherein the thickening part is connected to the surface of the other side of the insulating soft film through the third wire.

As an improvement of the present disclosure, the plurality of LEDs are connected in series in sequence.

As an improvement of the present disclosure, the flexible LED strip further includes a fourth wire, wherein the plurality of LEDs are connected in series in sequence through the fourth wire.

As an improvement of the present disclosure, conductive convex contact members are arranged at positions, between two adjacent LEDs, on the second wires; there are two convex contact members corresponding to the two second wires; the two convex contact members form a contact unit; and there are two contact units which are arranged side by side in a lengthwise direction of the second wires.

As an improvement of the present disclosure, connecting parts are arranged at positions, between two adjacent LEDs, on the first wires; the two first wires are connected for conduction through the connecting parts; and the two contact units are respectively located on two sides of the connecting parts.

As an improvement of the present disclosure, a first through hole penetrating through the insulating soft film from a front side to a rear side are arranged on the insulating soft film, and the first through hole is located at one end of the LEDs.

As an improvement of the present disclosure, a plurality of second through holes penetrating through the insulating soft film from front to back are further arranged on the insulating soft film; the second through holes are located between the first wires and the second wires; and the plurality of second through holes are distributed in the lengthwise direction of the second wires.

The present disclosure further provides a flexible LED strip, the flexible LED strip includes a long-strip-shaped insulating soft film, wherein a plurality of LEDs are arranged on a surface of one side of the insulating soft film in a lengthwise direction, and a thickening part is arranged on a surface of the other side of the insulating soft film in the lengthwise direction; and the thickening part is oriented towards the LEDs.

As an improvement of the present disclosure, the thickening part is a soldered thickening part.

As an improvement of the present disclosure, a plurality of first wires and a plurality of LEDs are arranged on a surface of one side of the insulating soft film in a lengthwise direction; the plurality of first wires are connected to each other for conduction; the plurality of LEDs are all located between two of the first wires; a plurality of second wires are arranged on a surface of the other side of the insulating soft film in the lengthwise direction; the plurality of second wires are connected to each other; the first wires are connected to one pin end of the LEDs; and the second wires are connected to the other pin end of the LEDs.

As an improvement of the present disclosure, the plurality of first wires are arranged side by side and connected to each other for conduction in a width direction of the insulating soft film, and the plurality of second wires are arranged side by side and connected to each other for conduction in the width direction of the insulating soft film.

As an improvement of the present disclosure, there are two first wires and two second wires.

As an improvement of the present disclosure, a width of the thickening part is greater than a width of each LED, and a length of the thickening part is greater than a length of each LED; the thickening part is a square; the flexible LED strip further includes a third wire; the thickening part is connected to a surface of the other side of the insulating soft film through the third wire.

The present disclosure has the beneficial effects: The flexible LED strip has an overall simple structure and is convenient to process and manufacture. The two first wires are arranged on two sides of the insulating soft film, so that an effect of connecting wires can be achieved, and the overall strength of the structure can be improved. This can prevent a broken circuit in the strip caused by breakage of the first wire and the second wire on either side, and greatly improve the reliability of the strip.

BRIEF DESCRIPTION OF THE DRAWINGS

To describe the technical solutions in the embodiments of the present disclosure more clearly, the following briefly introduces the accompanying drawings for describing the embodiments. The accompanying drawings in the following description show merely some embodiments of the present utility model, and a person of ordinary skill in the art may still derive other drawings from the accompanying drawings without creative efforts.

DETAILED DESCRIPTION OF THE EMBODIMENTS

The terms "first", "second" and "third" in the specification and claim of the present disclosure and the attached drawings are used to distinguish different objects rather than to describe a specific sequence. Furthermore, the term "includes", and any variation thereof, is intended to cover non-exclusive inclusion. For example, a process, method, system, product or device comprising a series of steps or units is not limited to the listed steps or units, but optionally also includes steps or units not listed, or optionally includes other steps or units inherent to those processes, methods, products or devices.

Reference to "an embodiment" herein means that a particular feature, structure or characteristic described in conjunction with an embodiment may be included in at least one embodiment of the present disclosure. The appearance of this phrase in various places in the specification does not necessarily refer to the same embodiment, nor is it a separate or alternative embodiment that is mutually exclusive with other embodiments. It is explicitly and implicitly understood by those skilled in the art that the embodiments described herein may be combined with other embodiments.

The term "plurality" means two or more. The term "and/or" describes an association relationship of associated objects, representing that three relationships may exist. For example, A and/or B may represent three situations: A exists alone; A and B exist simultaneously; and B exists alone. The character "/" usually indicates an "or" relation between associated objects.

Moreover, the terms "up, down, left, right, upper end, lower end, longitudinal, and the like" used to indicate orientations are all based on a posture and position of a device or equipment described in this scheme during normal use.

In order to make the aim, technical scheme and advantages of the invention clearer, the following will be combined with the accompanying drawings of embodiments of the present disclosure, The technical scheme in the embodiment of the invention is clearly and completely described, Obviously, the described embodiments are part of the embodiments of the present disclosure, and not all embodiments are based on the embodiments of the present disclosure, and all other embodiments attained by those of ordinary skill in the art without inventive effort are within the scope of the present disclosure.

Embodiment I

Figure 1:
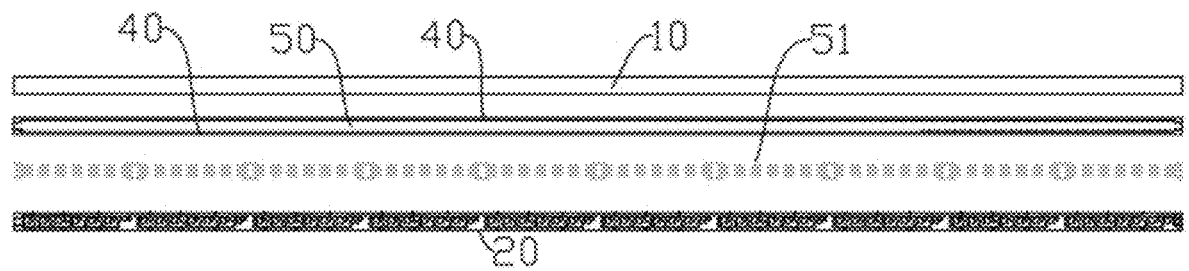
FIG. 1 is an exploded top view of a flexible LED strip according to the present disclosure.
Figure 2:
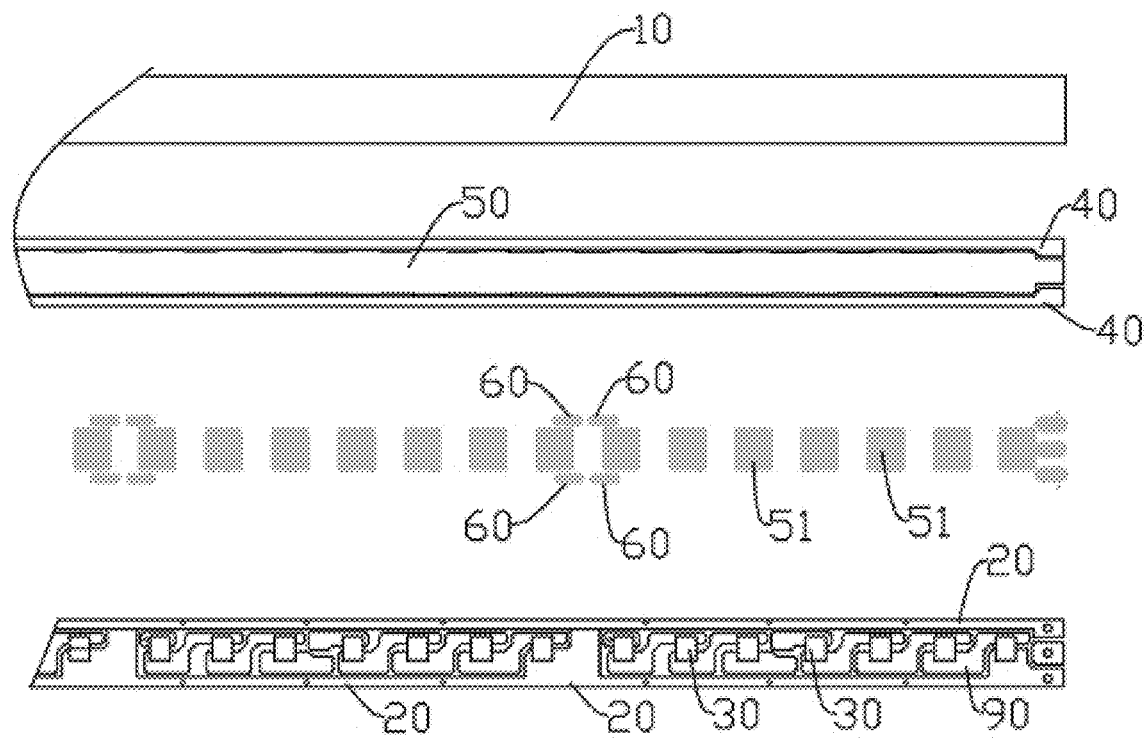
FIG. 2 is a partially enlarged view of FIG. 1.
Figure 3:
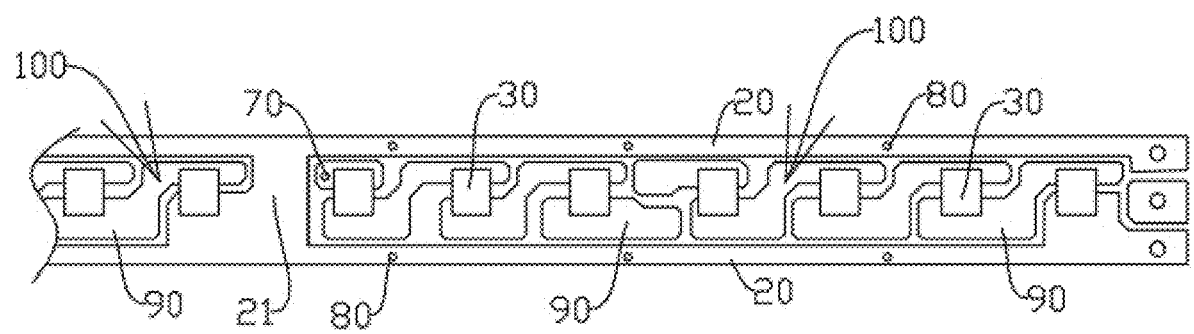
FIG. 3 is a partially enlarged view of FIG. 2.
Figure 4:
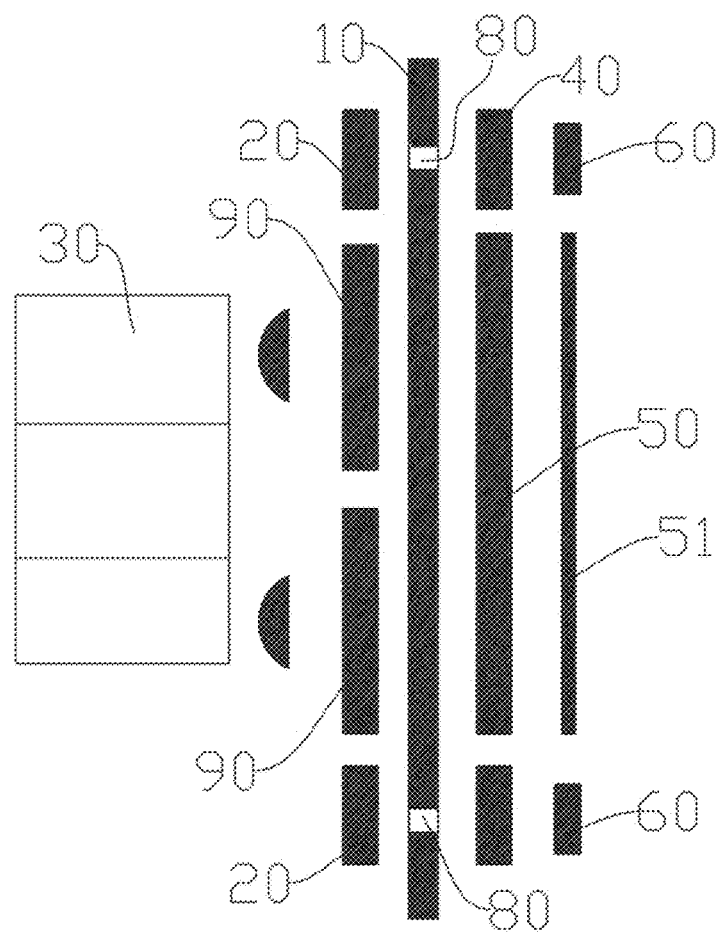
FIG. 4 is a sectional view of a flexible LED strip in an exploded state according to the present disclosure.

A flexible LED strip of a preferred embodiment of the present disclosure, as shown in FIG. 1 to FIG. 4, includes a long-strip-shaped insulating soft film 10. Two first wires 20 and a plurality of LEDs 30 are arranged on a surface of one side of the insulating soft film 10 in a lengthwise direction. The two first wire 20 are connected to each other for conduction, and the plurality of LEDs are located between the two first wires 20. Two second wires 40 and a third wire 50 are arranged on a surface of the other side of the insulating soft film 10 in the lengthwise direction. The two second wires 40 are arranged side by side in a width direction of the insulating soft film 10, and the third wire 50 is located between the two second wires 40. A width of the third wire 50 is generally 3 to 4 times greater than a width of each of the first wires 20. The first wires are connected to one pin end of the LEDs, and the second wires are connected to the other pin end of the LEDs. The flexible LED strip has an overall simple structure and is convenient to process and manufacture. The two first wires 20 are arranged on two sides of the insulating soft film 10, so that an effect of connecting wires can be achieved, and the overall strength of the structure can be improved. This can prevent a broken circuit in the strip caused by breakage of the first wire 20 and the second wire on either side, and greatly improve the reliability of the strip.

In this embodiment, a thickening part 51 is arranged at a position, corresponding to the LEDs 30, on the third wire 50. Projections of the LEDs 30 towards the third wire 50 are located in a region enclosed by an edge of the thickening part 51, which improves the structural strength of back surfaces of the LEDs 30 and prevents pins of the LEDs 30 from being separated from soldering tin due to low strength during curving or bending.

In this embodiment, the projections of the LED 30 towards the third wire 50 are square. A width of the third wire 50 is the same as a width of each projection, so as to further improve the structural strength of a mounting position of the LEDs 30 and reduce the degree of deformation of the strip.

In this embodiment, corresponding to the projections, soldering tin is arranged on the third wire. The soldering tin forms the thickening part 51. The thickening part 51 is directly formed by the soldering tin, facilitating processing and manufacturing. In addition, the thickening part 51 may also be formed by integrally welded or stamped with the third wire 50.

In this embodiment, the plurality of LEDs 30 are divided into a plurality of light-emitting units 100 in sequence. Each light-emitting unit 100 at least includes N LEDs 30 and N LEDs 30 are connected in series in sequence. One end of the light-emitting unit 100 is connected to the first wires 20 for conduction, and the other end is connected to the second wires for conduction. N is a positive integer greater than 1. By the arrangement of the plurality of light-emitting units 100, a user can conveniently obtain a strip with a desired length by cutting according to a need, which is convenient and practical.

In this embodiment, a conductive convex contact member 60 is arranged at a position, between two adjacent light-emitting units 100, on each second wire 40. There are two convex contact members 60 corresponding to the two second wires 40. The two convex contact members 60 form a contact unit. There are two contact units arranged side by side in lengthwise direction of the second wires. By the arrangement of the convex contact members 60, it is convenient for a user to cut the strip at a specific position and to mount connects after cutting, thereby ensuring stable contact between the second wires 40 and the connectors and avoiding poor contact.

In this embodiment, connecting parts 21 are arranged at positions, between two adjacent light-emitting units 100, on the first wires 20. The two first wires 20 are connected for conduction through the connecting parts 21. The two contact units are respectively located on two sides of the connecting parts 21, so that after a user cuts the strip along the connecting parts 21, the two sections of strips obtained by cutting have the convex contact members 60, which facilitates the mounting of the connectors.

In this embodiment, the insulating soft film 10 is provided with a first through hole 70 that penetrates through the front and rear sides. The first through hole 70 is located at one end of the light-emitting units 100. During assembling, the light-emitting unit 100 can be connected to the second wires for conduction by filling the first through hole 70 with soldering tin. The third wire 50 can further improve the overall structural strength of the strip.

In this embodiment, a plurality of second through holes 80 penetrating through the insulating soft film from front to back are further arranged on the insulating soft film 10; the second through holes 80 are located between the first wires 20 and the second wires 40; and the plurality of second through holes 80 are distributed in the lengthwise direction of the second wires 40, so that it is convenient to conduct, at a plurality of positions, the first wires 20 and the second wires 40 on the front and rear sides to ensure the stability.

In this embodiment, long edges of the N LEDs 30 included in each light-emitting unit 100 are perpendicular to a long edge of the insulating soft film 10. The N LEDs 30 are connected end to end in sequence for conduction through N−1 fourth wires 90, thus achieving series connection. The first wires 20, the second wires 40, the third wire 50, the fourth wires 90, and the connecting parts 21 are all sheet-like and abut against the insulating soft film 10 to ensure that the strip is thin.

Embodiment II

Referring to FIG. 1 to FIG. 4, a flexible LED strip includes a long-strip-shaped insulating soft film. A plurality of first wires and a plurality of LEDs are arranged on a surface of one side of the insulating soft film in a lengthwise direction; the plurality of first wires are connected to each other for conduction; the plurality of LEDs are all located between two of the first wires; a plurality of second wires are arranged on a surface of the other side of the insulating soft film in the lengthwise direction; the plurality of second wires are connected to each other for conduction; the first wires are connected to one pin end of the LEDs for conduction; and the second wires are connected to the other pin end of the LEDs for conduction. Through the above structure, the first wires are connected to one pin end of the LEDs for conduction, and the second wires are connected to the other pin end of the LEDs for conduction. The first wires 20 are used as negative electrodes, and the second wires 40 are used as positive electrodes. Of course, the first wires can be positive electrodes, and the second wires can be negative electrodes. The flexible LED strip has an overall simple structure and is convenient to process and manufacture. The plurality of first wires 20 and the plurality of second wires are arranged on two sides of the insulating soft film 10, so that an effect of connecting wires can be achieved, and the overall strength of the structure can be improved. This can prevent a broken circuit in the strip caused by breakage of the first wire 20 on either side, and greatly improve the reliability of the strip. Meanwhile, the plurality of first wires and the plurality of second wires can improve the current carrying capacity of the strip, so that the strip can bear higher current, and more LEDs can be mounted on the strip. The plurality of first wires are arranged side by side and connected to each other for conduction in a width direction of the insulating soft film, and the plurality of second wires are arranged side by side and connected to each other for conduction in the width direction of the insulating soft film. Further, there are two first wires and two second wires.

In this embodiment, a thickening part is arranged on the surface of the other side of the insulating soft film in the lengthwise direction, and the thickening part is oriented towards the LEDs. The thickening part is a soldering tin thickening part. Specifically, a width of the thickening part is greater than a width of each LED, and a length of the thickening part is greater than a length of each LED. Further, the thickening part is square. Through the above structure, the thickening part can play a role in improving the structural strength of back surfaces of the LEDs 30 and prevents pins of the LEDs 30 from being separated from the first wires and the second wires due to low strength during curving or bending. Further, the flexible LED strip includes a third wire. The thickening part is connected to the surface of the other side of the insulating soft film through the third wire. Furthermore, the third wire can also play a role in improving the structural strength of back surfaces of the LEDs 30 and prevents pins of the LEDs 30 from being separated from the first wires and the second wires due to low strength during curving or bending.

The plurality of LEDs are connected in series in sequence. By the arrangement of the LEDs, a user can conveniently obtain a strip with a desired length by cutting according to a need, which is convenient and practical. The flexible LED strip further includes a fourth wire. The plurality of LEDs are connected in series in sequence through the fourth wire.

In this embodiment, conductive convex contact members are arranged at positions, between two adjacent LEDs, on the second wires; there are two convex contact members corresponding to the two second wires; the two convex contact members form a contact unit; and there are two contact units which are arranged side by side in a lengthwise direction of the second wires. Through the above structure, by the arrangement of the convex contact members 60, it is convenient for a user to cut the strip at a specific position and to mount connects after cutting, thereby ensuring stable contact between the second wires 40 and the connectors and avoiding poor contact.

In this embodiment, connecting parts are arranged at positions, between two adjacent LEDs, on the first wires. The two first wires are connected for conduction through the connecting parts. The two contact units are respectively located on two sides of the connecting parts, so that after a user cuts the strip along the connecting parts 21, the two sections of strips obtained by cutting have the convex contact members 60, which facilitates the mounting of the connectors.

In this embodiment, a first through hole penetrating through the insulating soft film from a front side to a rear side are arranged on the insulating soft film, and the first through hole is located at one end of the LEDs. During assembling, the light-emitting units 100 can be connected to the second wires for conduction by filling the first through hole 70 with soldering tin. The third wire can further improve the overall structural strength of the strip.

In this embodiment, a plurality of second through holes penetrating through the insulating soft film from front to back are further arranged on the insulating soft film; the second through holes are located between the first wires and the second wires; and the plurality of second through holes are distributed in the lengthwise direction of the second wires, so that it is convenient to conduct, at a plurality of positions, the first wires 20 and the second wires 40 on the front and rear sides to ensure the stability.

Embodiment III

Referring to FIG. 1 to FIG. 4, a flexible LED strip includes a long-strip-shaped insulating soft film. A plurality of LEDs are arranged on a surface of one side of the insulating soft film in a lengthwise direction, and a thickening part is arranged on a surface of the other side of the insulating soft film in the lengthwise direction; and the thickening part is oriented towards the LEDs. The thickening part is a soldering tin thickening part. Specifically, a width of the thickening part is greater than a width of each LED, and a length of the thickening part is greater than a length of each LED. Further, the thickening part is square. Through the above structure, the thickening part can play a role in improving the structural strength of back surfaces of the LEDs 30 and prevents pins of the LEDs 30 from being separated from the first wires and the second wires due to low strength during curving or bending. Further, the flexible LED strip includes a third wire. The thickening part is connected to the surface of the other side of the insulating soft film through the third wire. Furthermore, the third wire can also play a role in improving the structural strength of back surfaces of the LEDs 30 and prevents pins of the LEDs 30 from being separated from the first wires and the second wires due to low strength during curving or bending.

In this embodiment, a plurality of first wires and a plurality of LEDs are arranged on a surface of one side of the insulating soft film in a lengthwise direction; the plurality of first wires are connected to each other for conduction; the plurality of LEDs are all located between two of the first wires; a plurality of second wires are arranged on a surface of the other side of the insulating soft film in the lengthwise direction; the plurality of second wires are connected to each other for conduction; the first wires are connected to one pin end of the LEDs for conduction; and the second wires are connected to the other pin end of the LEDs for conduction. The plurality of first wires are arranged side by side and connected to each other for conduction in a width direction of the insulating soft film, and the plurality of second wires are arranged side by side and connected to each other for conduction in the width direction of the insulating soft film. Specifically, there are two first wires and two second wires. Through the above structure, the first wires are connected to one pin end of the LEDs for conduction, and the second wires are connected to the other pin end of the LEDs for conduction. The first wires 20 are used as negative electrodes, and the second wires 40 are used as positive electrodes. Of course, the first wires can be positive electrodes, and the second wires can be negative electrodes. The flexible LED strip has an overall simple structure and is convenient to process and manufacture. The plurality of first wires 20 and the plurality of second wires are arranged on two sides of the insulating soft film 10, so that an effect of connecting wires can be achieved, and the overall strength of the structure can be improved. This can prevent a broken circuit in the strip caused by breakage of the first wire 20 on either side, and greatly improve the reliability of the strip. Meanwhile, the plurality of first wires and the plurality of second wires can improve the current carrying capacity of the strip, so that the strip can bear higher current, and more LEDs can be mounted on the strip. The plurality of first wires are arranged side by side and connected to each other for conduction in a width direction of the insulating soft film, and the plurality of second wires are arranged side by side and connected to each other for conduction in the width direction of the insulating soft film. Further, there are two first wires and two second wires.

The flexible LED strip further includes a third wire. The thickening part is connected to the surface of the other side of the insulating soft film through the third wire. Through the above structure, the third wire can also play a role in improving the structural strength of back surfaces of the LEDs 30 and prevents pins of the LEDs 30 from being separated from the first wires and the second wires due to low strength during curving or bending.

It should be understood that the application of the present disclosure is not limited to the embodiments mentioned above. Those of ordinary skill in the art can obtain improvements or modifications based on the above descriptions. All such improvements and modifications should fall within the scope of protection of the claims of the present disclosure.

What is claimed is:

1. A flexible light-emitting diode (LED) strip, comprising a long-strip-shaped insulating soft film, wherein a plurality of first wires and a plurality of LEDs are arranged on a surface of one side of the insulating soft film in a lengthwise direction; the plurality of first wires are connected to each other for conduction; the plurality of LEDs are all located between two of the first wires; a plurality of second wires are arranged on a surface of the other side of the insulating soft film in the lengthwise direction; the plurality of second wires are connected to each other for conduction; the first wires are connected to one pin end of the LEDs for conduction; and the second wires are connected to the other pin end of the LEDs for conduction.

2. The flexible LED strip according to claim 1, wherein the plurality of first wires are arranged side by side and connected to each other for conduction in a width direction of the insulating soft film, and the plurality of second wires are arranged side by side and connected to each other for conduction in the width direction of the insulating soft film.

3. The flexible LED strip according to claim 1, wherein there are two first wires and two second wires.

4. The flexible LED strip according to claim 1, wherein a thickening part is arranged on the surface of the other side of the insulating soft film in the lengthwise direction, and the thickening part is oriented towards the LEDs.

5. The flexible LED strip according to claim 4, wherein the thickening part is a soldering tin thickening part.

6. The flexible LED strip according to claim 4, wherein a width of the thickening part is greater than a width of each LED, and a length of the thickening part is greater than a length of each LED.

7. The flexible LED strip according to claim 4, wherein the thickening part is square.

8. The flexible LED strip according to claim 4, further comprising a third wire, wherein the thickening part is connected to the surface of the other side of the insulating soft film through the third wire.

9. The flexible LED strip according to claim 1, wherein the plurality of LEDs are connected in series in sequence.

10. The flexible LED strip according to claim 9, further comprising a fourth wire, wherein the plurality of LEDs are connected in series in sequence through the fourth wire.

11. The flexible LED strip according to claim 3, wherein conductive convex contact members are arranged at positions, between two adjacent LEDs, on the second wires; there are two convex contact members corresponding to the two second wires; the two convex contact members form a contact unit; and there are two contact units which are arranged side by side in a lengthwise direction of the second wires.

12. The flexible LED strip according to claim 11, wherein connecting parts are arranged at positions, between two adjacent LEDs, on the first wires; the two first wires are connected for conduction through the connecting parts; and the two contact units are respectively located on two sides of the connecting parts.

13. The flexible LED strip according to claim 1, wherein a first through hole penetrating through the insulating soft film from a front side to a rear side are arranged on the insulating soft film, and the first through hole is located at one end of the LEDs.

14. The flexible LED strip according to claim 1, wherein a plurality of second through holes penetrating through the insulating soft film from front to back are further arranged on the insulating soft film; the second through holes are located between the first wires and the second wires; and the plurality of second through holes are distributed in the lengthwise direction of the second wires.

15. A flexible LED strip, comprising a long-strip-shaped insulating soft film, wherein a plurality of LEDs are arranged on a surface of one side of the insulating soft film in a lengthwise direction, and a thickening part is arranged on a surface of the other side of the insulating soft film in the lengthwise direction; and the thickening part is oriented towards the LEDs;
wherein a plurality of first wires and a plurality of LEDs are arranged on a surface of one side of the insulating soft film in a lengthwise direction: the plurality of first wires are connected to each other for conduction; the plurality of LEDs are all located between two of the first wires; a plurality of second wires are arranged on a surface of the other side of the insulating soft film in the lengthwise direction; the plurality of second wires are connected to each other; the first wires are connected to one pin end of the LEDs; and the second wires are connected to the other pin end of the LEDs.

16. The flexible LED strip according to claim 15, wherein the thickening part is a soldered thickening part.

17. The flexible LED strip according to claim 15, wherein the plurality of first wires are arranged side by side and connected to each other for conduction in a width direction of the insulating soft film, and the plurality of second wires are arranged side by side and connected to each other for conduction in the width direction of the insulating soft film.

18. The flexible LED strip according to claim 15, wherein there are two first wires and two second wires.

19. The flexible LED strip according to claim 15, wherein a width of the thickening part is greater than a width of each LED, and a length of the thickening part is greater than a length of each LED; the thickening part is a square; the flexible LED strip further comprises a third wire; the thickening part is connected to a surface of the other side of the insulating soft film through the third wire.

20. A flexible LED strip, comprising a long-strip-shaped insulating soft film, wherein a plurality of LEDs are arranged on a surface of one side of the insulating soft film in a lengthwise direction, and a thickening part is arranged on a surface of the other side of the insulating soft film in the lengthwise direction; and the thickening part is oriented towards the LEDs;
wherein a width of the thickening part is greater than a width of each LED, and a length of the thickening part is greater than a length of each LED.

* * * * *